March 8, 1966 I. AMES 3,239,375

METHOD OF FABRICATING HIGH GAIN CRYOTRONS

Filed June 28, 1962

PRESENT INVENTION

INVENTOR
IRVING AMES

BY Elmer W Galliati

ATTORNEY 3,239,375

METHOD OF FABRICATING HIGH GAIN CRYOTRONS

Irving Ames, Peekskill, N.Y., assignor to International Business Machines Corporation, New York, N.Y., a corporation of New York Filed June 28, 1962, Ser. No. 206,099
11 Claims. (Cl. 117—212)

This invention relates to cryogenic circuitry and more particularly to a method of fabricating improved thin film cryotrons.

A cryotron consists of a gating element which has resistive and superconductive states and a control element positioned so that the magnetic field generated by current in the control element can change the gating element from the superconductive state to the resistive state. The static gain of a cryotron is defined as the ratio between the critical current of the gating element divided by the critical current of the control element. That is, the static gain of a cryotron is defined as the magnitude of the current needed in the gating element (with no current in the control element) to make the gating element resistive divided by the amount of current needed in the control element (with no current in the gating element) to make the gating element resistive. The gain of a cryotron can be increased by either decreasing the critical current of the control element or by increasing the critical current of the gating element. The present invention relates to a method of increasing the gain of a cryotron by increasing the critical current of the gating element.

The method of fabricating cryogenic gating elements by vapor deposition techniques is well known. According to these methods, the chamber wherein the vapor deposition is performed is highly evacuated in order to remove impurities such as water vapor and other gases and so that conditions can be accurately controlled and reproduced. The present invention relates to a method of depositing a gating element in the presence of a controlled amount of a reactive gas whereby a gating element having improved characteristics is obtained. Gating elements fabricated in accordance with the teachings of the present invention have an increased critical current, a more continuous grain structure, and exhibit less hysteresis.

An article by H. Caswell entitled "Effect of Residual Gases on Superconducting Characteristics of Tin Films" in the January 1961 issue of the Journal of Applied Physics discusses the deposition of gating elements in the presence of oxygen. The above article does not teach the particular oxygen pressure needed in order to obtain a film with an increased critical current and more continuous grain structure. Furthermore, it does not teach how to decrease the magnetic hysteresis of a film without affecting the sharpness of the magnetic transition as does the present invention.

An object of the present invention is to provide a method of fabricating high gain cryotrons.

Another object of the present invention is to provide a method of fabricating a gating element which has a high critical current.

Yet another object of the present invention is to provide a method of fabricating a gating element with an improved grain structure.

Still another object of the present invention is to provide a method of fabricating a cryogenic gating element which exhibits relatively little hysteresis.

The foregoing and other objects, features and advantages of the invention will be apparent from the following more particular description of a preferred embodiment of the invention, as illustrated in the accompanying drawings.

The fabrication of thin film cryotrons by vapor deposition techniques is well known. It is known that cryotrons can be fabricated with indium gating elements and lead control elements. Apparatus for fabricating thin film cryotrons by vapor deposition is shown among other places in copending application Serial No. 135,920 filed September 5, 1961 by J. Priest and H. L. Caswell, entitled "Method for Depositing Silicon Monoxide Film" (IBM Docket 10,464) which is assigned to the assignee of the present invention.

According to the teachings in the prior art, the gating element of a cryotron is deposited in a chamber which is highly evacuated in order to obtain uniformity and reproducibility. Unless the gating element is deposited in a highly evacuated chamber, impurities will produce undesirable characteristics in the gating element. By having a very high vacuum in the chamber where the deposition takes place most of the impurities are eliminated. The effect of impurities is discussed in an article by H. L. Caswell entitled "Effect of Residual Gases on the Properties of Indium Films" in the December 1961 issue of the Journal of Applied Physics.

According to the present invention, the chamber is first highly evacuated in order to remove impurities. Next, a controlled amount of a reactive gas is introduced into the system. Thereafter the gating element is deposited in the presence of the reactive gas. Gating elements fabricated in accordance with the above procedure have improved characteristics as discussed below.

Figure 1A:
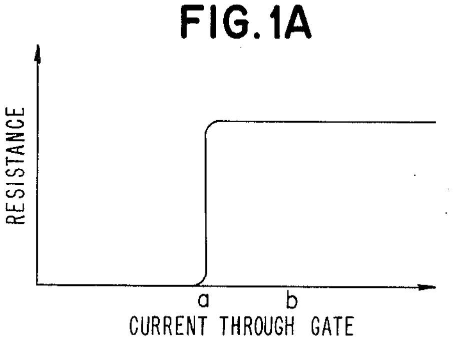
PRIOR ART FIG. 1A
FIGURE 1A is a graph which shows the current carrying capacity of a gating element fabricated according to the prior art.
Figure 1B:
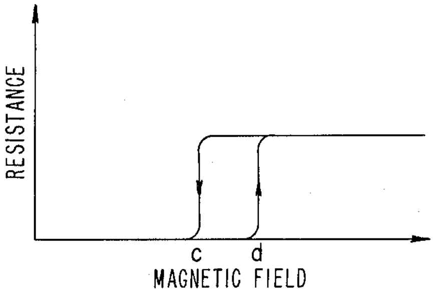
FIGURE 1B is a graph showing the magnetic hysteresis of a gating element fabricated in accordance with the prior art.

FIGURES 1A and 1B show the characteristics of a gating element fabricated in accordance with the teachings of the prior art. That is, FIGURES 1A and 1B show the characteristics of a gating element which was deposited in a highly evacuated chamber and the edges of which were passivated (effectively removed) as taught by the prior art. FIGURE 1A is a graph of the resistance of a gating element versus the current in the gating element. It shows that for a particular amount of current designated "*a*" the gating element has a transition from the superconductive state to the resistive state. If no more than "*a*" units of current are passing through the gating element the gating element is resistive and if less than "*a*" units of current are flowing through the gating element it is superconductive. FIGURE 1B is a graph of the resistance of the gating element versus the magnetic field applied to the gating element. The magnetic field may, for example, be applied to the gating element by a control element. FIGURE 1B shows that as the magnetic field is increased, "*d*" units of magnetic field are required to make the gating element resistive. However, as the magnetic field is decreased, the gating element does not become superconductive until the magnitude of the magnetic field is decreased below "c" units. The distance between "c" and "d" is a measure of the magnetic hysteresis which the gating element exhibits.

Figure 2A:
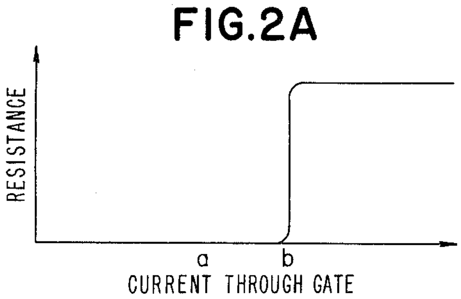
FIGURE 2A is a graph showing the current carrying capacity of a gating element fabricated in accordance with the present invention.
Figure 2B:
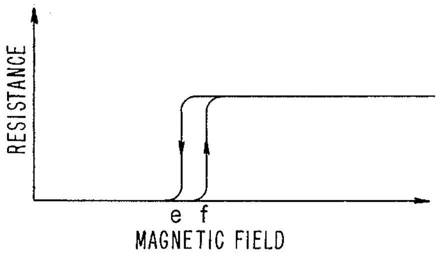
FIGURE 2B is a graph showing the magnetic hysteresis of a gating element fabricated in accordance with the present invention.

FIGURES 2A and 2B show the characteristics of a gating element fabricated in accordance with the present invention. FIGURE 2A, which is similar to FIGURE 1A, shows the relationship between the current through a gating element and the resistance of the gating element. FIGURE 2A shows that the gating element is resistive when it is carrying more than "b" units of current and that it is superconducting whenever it is carrying less than "b" units of current. It should be noted that the critical current of the gate fabricated according to the present invention (FIGURE 2A) is much larger than the critical current of the gate fabricated in accordance with the prior art (FIGURE 1A).

FIGURE 2B shows the resistance of the gating element with respect to the magnetic field applied to the gating element by some external source such as a control element. As the magnetic field is increased, the gating element becomes resistive when "f" units of magnetic field are applied; however, as the magnetic field is decreased, the gating element becomes superconductive only after the magnetic field is decreased below "e" units.

The parameter of interest is the distance between "e" and "f" which is a measure of the magnetic hysteresis. It is desirable to make the magnetic hysteresis as small as possible since among other beneficial effects a gating element which exhibits a small amount of magnetic hysteresis has sharp transition characteristics. Gating elements fabricated according to the present invention (FIGURE 2B) exhibit less magnetic hysteresis than gating elements fabricated according to the prior art (FIGURE 1B).

Figures 3, 4A, 4B:
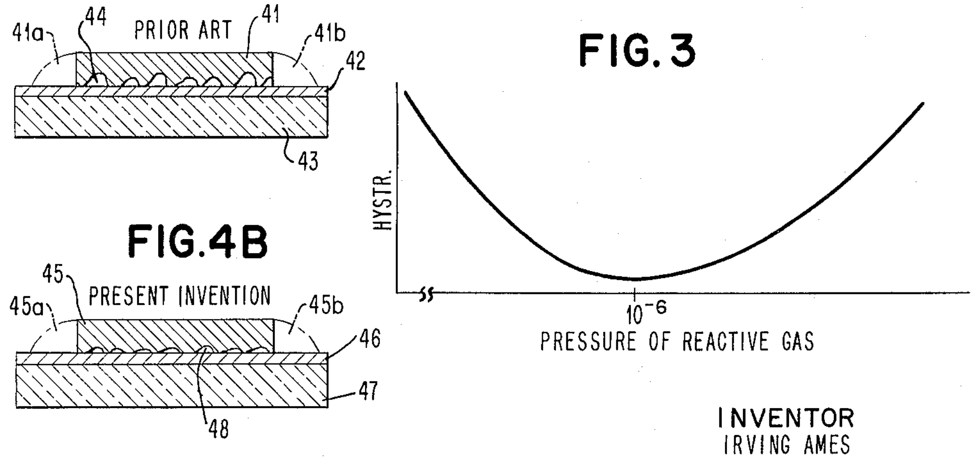
FIGURE 3 is a graph which shows the variations in hysteresis with the amount of reactive gases present during the deposition of the gating element.
FIGURE 4A is a cross-sectional view of a gating element deposited in a high vacuum.
FIGURE 4B is a cross-sectional view of a gating element deposited in accordance with the present invention.

FIGURE 3 shows the variation in the amount of magnetic hysteresis which a gating element exhibits in relation to the amount of reactive gas (oxygen in the case of the particular example hereinafter given) in the chamber during the deposition process. The particular gating element hereinafter described exhibits a minimum amount of hysteresis when $10^{-6}$ Torr of oxygen are present in the chamber during the deposition of the gating element. The exact location of the minimum will vary slightly depending upon the thickness of the gating element, its temperature, etc.; however, the minimum will be in the general area of $10^{-6}$ Torr.

By taking highly enlarged photomicrographs, it is known that the lower layer of most gating elements is not entirely continuous. This may be due to the fact that as the gating element is deposited, it does not "wet" the layer of insulating material upon which it is deposited. Thus, the first material deposited generally tends to accumulate in clusters. As the thickness of the element increases the open spaces are covered over.

Films deposited in accordance with the present invention become continuous closer to the substrate than film deposited in accordance with the prior art. That is, the clusters which form near the substrate are joined closer to the substrate. FIGURE 4A shows a cross-sectional view of an indium gating element 41 which is deposited on a thin layer of silicon monoxide 42 which in turn is deposited on substrate 43. The gating element 41 was deposited in a highly evacuated chamber. It can be seen that the lower layers of the film have a large number of relatively large openings 44 therein.

FIGURE 4B shows a cross-sectional view of an indium gating element 45 which is deposited over a thin film of silicon monoxide 46 which in turn is deposited on a substrate 47. The gating element 45 was deposited in a chamber which was first highly evacuated in order to remove impurities, and then filled with a controlled amount of oxygen during the deposition of the gating element 45. That is, gating element 45 shown in FIGURE 4B was deposited according to the present invention. It is easily seen that the gating element 45 deposited according to the present invention becomes continuous closer to the substrate. Furthermore, the open spaces 48 are much smaller than the open spaces 44.

A possible theoretical explanation for gating elements fabricated in accordance with the present invention having a higher critical current is that the higher critical current results directly from the fact that the gating elements fabricated in accordance with the present invention are continuous closer to the substrate. When a gating element is entirely superconductive, the current therein is generally distributed uniformly across the width (as contrasted to the thickness) of the gating element. Where the lower layer of the gating element has large vacant spaces therein, the areas of the gating element directly above these vacant spaces have higher density current flowing therein, and hence these areas tend to become resistive sooner. When some areas become resistive, the current is shifted to the other areas of the film thereby making the current in the other areas more dense, and switching these other areas to the resistive state. The result is that the gating element switches from the superconductive state to the resistive state with a lower total current. Naturally, the present invention is not related to the theoretical explanation given above. It is a physical fact that gating elements fabricated in accordance with the present invention exhibit a higher critical current. The above is merely one possible explanation of why this occurs.

The edges 41_a_ and 41_b_ of gating element 41 and the edges 45_a_ and 45_b_ of gating element 45 have been passivated (i.e., removed or otherwise effectively removed from the device) to sharpen the transition characteristics. The edges can be passivated by any one of a number of ways including physical removal as described in U.S. Patent 2,989,716 by A. E. Brennemann and passivation by the use of gold alloying as described in copending application Serial No. 205,945, filed June 28, 1962 by I. Ames entitled "Edge Passivation" (IBM Docket 10,569) which is assigned to the assignee of the present invention.

The top surface of films 41 and 45 is shown in FIGURES 4A and 4B as being smooth. As shown in an article "Effect of Residual Gases on Superconducting Characteristics of Tin Films" by H. Caswell published in the January 1961 issue of the Journal of Applied Physics the top surface of the tin films is in fact not smooth. However, the exact nature of the top surface of the film is not particularly relevant to the present invention, hence for convenience of illustration, the top surface is shown as substantially smooth.

One specific example of the conditions possible during the deposition of a gating element according to the present invention will now be given. However, it should be clearly understood that the scope of the present invention is only limited by the hereinafter appended claims, and it is not limited by the particular example. The example given merely represents one specific way in which the principles of the present invention may be employed.

Initially the substrate whereon the gating element is to be deposited is prepared in the usual manner. This includes covering the substrate with a layer of silicon monoxide insulating material. This first step in the process is to highly evacuate the chamber wherein the deposition is going to be performed in order to remove impurities. The chamber is evacuated to a pressure of $.5\times10^{-6}$ Torr. After the chamber is evacuated to $.5\times10^{-6}$ Torr it still contains water vapor, carbon monoxide insulating material. The first step in the chamber exerts a pressure of approximately $.1\times10^{-6}$ Torr and the other gases including the water vapor and carbon monoxide exert a pressure of approximately $.4\times10^{-6}$ Torr.

After the chamber is evacuated to $.5\times10^{-6}$ Torr, oxygen is introduced into the chamber until the total pressure in the chamber is $1.4 \times 10^{-6}$ Torr. At this point the oxygen in the chamber exerts a pressure of $1.0 \times 10^{-6}$ Torr and the other gases including the water vapor and carbon monoxide exert a pressure of $.4 \times 10^{-6}$ Torr.

After the oxygen is introduced into the system, indium is deposited through a mask to form the gating element in an otherwise conventional manner at a rate of 60 angstroms per second. During the deposition of the indium, the pressure is held at $1.5 \times 10^{-6}$ Torr by the addition of oxygen.

An indium gating element 5,000 angstroms thick and 5 mils wide fabricated in accordance with the teaching of the present invention has a critical current of approximately 300 milliamps at 95 percent of its critical temperature. This compares with a critical current of approximately 200 milliamperes for a similar gating element fabricated in accordance with the teaching of the prior art.

Naturally, it should be understood that gating elements can be made from a relatively large number of materials other than indium, such as tin and various tin-indium alloys. The effects of having a reactive gas in the chamber during the deposition of any of these materials is substantially the same.

A cryotron consists of more than a gating element; however, the other parts of the cryotron including the control element, the insulating material, and the various conductors are fabricated in a conventional manner which is known in the prior art. Hence, it is not described herein. A cryotron with a high static gain is fabricated by fabricating the gating element according to the present invention and fabricating the remaining portion of the cryotron as taught by the prior art.

While the invention has been particularly shown and described with reference to a preferred embodiment thereof, it will be understood by those skilled in the art that various changes in form and details may be made therein without departing from the spirit and scope of the invention.

What is claimed is:

1. The method of fabricating in an evacuated chamber a cryotron having a high static gain upon a rigid substrate comprising the steps of,
highly evacuating said chamber in order to remove most of the impurities therefrom,
introducing a reactive gas into said chamber to establish and maintain the pressure of said reactive gas at approximately $10^{-6}$ Torr,
vapor depositing a second superconductive material form a gating element upon said substrate in the presence of said reactive gas, said reactive gas being effective to increase wetting of said substrate by said first superconductive material,
passivating the edges of said gating element, and
vapor depositing a second superconductive material to form a control element over said gating element.

2. The method of fabricating in an evacuated chamber a cryotron having a high static gain upon a rigid substrate comprising the steps of,
highly evacuating said chamber in order to remove most of the impurities therefrom,
introducing oxygen into said chamber to establish and maintain the oxygen pressure at approximately $10^{-6}$ Torr,
depositing an indium gating element in the presence of said oxygen,
passivating the edges of said gating element and,
depositing a control element over said gating element.

3. The method of fabricating in an evacuated chamber a cryotron having a high static gain upon a rigid substrate comprising the steps of,
highly evacuating said chamber in order to remove most of the impurities therefrom,
introducing oxygen into said chamber to establish and maintain the oxygen pressure at approximately $10^{-6}$ Torr,
depositing a tin gating element upon said substrate in the presence of said oxygen,
passivating the edges of said gating element, and
depositing a control element over said gating element.

4. The method of fabricating by vapor deposition a cryogenic gating element having a high critical current upon a rigid substrate comprising the steps of,
evacuating a deposition chamber to a high degree in order to remove impurities from said chamber,
introducing a slight amount of reactive gas into said chamber to establish and maintain the pressure of said reactive gas at approximately $10^{-6}$ Torr,
vapor depositing a superconductive mataerial to form said gating element upon said substrate in the presence of said reactive gas, said reactive gas being effective to increase wetting of said substrate by said superconductive material, and
passivating the edges of said gating element.

5. The method of fabricating by vapor deposition a cryogenic gating element having a high critical current upon a rigid substrate comprising the steps of,
evacuating a deposition chamber to a high degree in order to remove impurities from said chamber,
introducing oxygen into said chamber to establish an oxygen pressure of approximately $10^{-6}$ Torr,
depositing said gating element upon said substrate in the presence of said oxygen, and
passivating the edges of said gating element.

6. The method of fabricating by vapor deposition an indium gating element having a high critical current upon a rigid substrate comprising the steps of,
evacuating said deposition chamber to a high degree in order to remove impurities from said chamber,
introducing a slight amount of oxygen into said chamber to establish an oxygen pressure of approximately $10^{-6}$ Torr,
depositing said indium gating element upon said substrate in the presence of said oxygen at a rate of approximately 60 angstroms per second, and
passivating the edges of said gating element.

7. The method of fabricating by vapor deposition a tin gating element having a high critical current upon a rigid substrate comprising the steps of,
evacuating said deposition chamber to a high degree in order to remove impurities from said chamber,
introducing a slight amount of oxygen into said chamber to establish an oxygen pressure of approximately $10^{-6}$ Torr,
depositing said tin gating element upon said substrate in the presence of said oxygen at a rate of approximately 60 angstroms per second, and
passivating the edges of said gating element.

8. The method of fabricating an improved cryogenic element upon a rigid substrate comprising the steps of,
evacuating a deposition chamber to a high degree in order to remove impurities from said chamber,
introducing a reactive gas into said chamber to establish a pressure of approximately $10^{-6}$ Torr of said reactive gas, and
vapor depositing a superconductive material to form element upon said substrate in the presence of said reactive gas, said reactive gas being effective to increase wetting of said substrate by said superconductive material.

9. The method of fabricating by vapor deposition an improved indium gating element upon a rigid substrate comprising the steps of,
evacuating a deposition chamber to at least $.5 \times 10^{-6}$ Torr in order to remove impurities from said chamber,
introducing oxygen into said chamber to raise the pressure to $10^{-6}$ Torr, and depositing said indium gating element upon said substrate in the presence of said oxygen.

10. The method of fabricating by vapor deposition an improved tin gating element upon a rigid substrate comprising the steps of, evacuating a deposition chamber to at least $.5 \times 10^{-6}$ Torr in order to remove impurities from said chamber, introducing oxygen into said chamber to raise the pressure to approximately $10^{-6}$ Torr, and depositing said tin gating element upon said substrate in the presence of said oxygen.

11. The method of depositing by vapor deposition an indium gating element upon a rigid substrate comprising the steps of, evacuating a deposition chamber to a high degree in order to remove impurities from said chamber, introducing a reactive gas to said chamber to raise the pressure to approximately $10^{-6}$ Torr, vapor depositing said indium gating element upon said substrate in the presence of said reactive gas, said reactive gas being effective to increase wetting of said substrate by said gating element, and passivating the edges of said gating element.

References Cited by the Examiner

UNITED STATES PATENTS

| | | | |
|---|---|---|---|
| 2,904,452 | 9/1959 | Reichelt | 117—106 |
| 3,085,913 | 4/1963 | Caswell | 118—49 |

OTHER REFERENCES

Caswell Publication, "J. App. Physics," vol. 32, No. 1, January 1961, pp. 105–114.

JOSEPH B. SPENCER, *Primary Examiner.*

RICHARD D. NEVIUS, *Examiner.*